United States Patent
Shin et al.

(10) Patent No.: US 10,246,773 B2
(45) Date of Patent: Apr. 2, 2019

(54) METHOD FOR FORMING AMORPHOUS THIN FILM

(71) Applicant: EUGENE TECHNOLOGY CO., LTD., Yongin-si, Gyeonggi-do (KR)

(72) Inventors: Seung-Woo Shin, Hwaseong-si (KR); Cha-Young Yoo, Suwon-si (KR); Woo-Duck Jung, Suwon-si (KR); Ho-Min Choi, Yongin-si (KR); Wan-Suk Oh, Icheon-si (KR); Koon-Woo Lee, Yongin-si (KR); Hyuk-Lyong Gwon, Siheung-si (KR); Ki-Ho Kim, Asan-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/568,536

(22) PCT Filed: May 9, 2016

(86) PCT No.: PCT/KR2016/004833
§ 371 (c)(1),
(2) Date: Oct. 23, 2017

(87) PCT Pub. No.: WO2016/182296
PCT Pub. Date: Nov. 17, 2016

(65) Prior Publication Data
US 2018/0112307 A1    Apr. 26, 2018

(30) Foreign Application Priority Data

May 8, 2015  (KR) .................. 10-2015-0064857

(51) Int. Cl.
| | | |
|---|---|---|
| C23C 16/24 | (2006.01) | |
| C23C 16/38 | (2006.01) | |
| H01L 21/3205 | (2006.01) | |
| C23C 16/42 | (2006.01) | |
| H01L 21/02 | (2006.01) | |
| C23C 16/22 | (2006.01) | |
| B82Y 40/00 | (2011.01) | |

(52) U.S. Cl.
CPC .............. *C23C 16/38* (2013.01); *C23C 16/22* (2013.01); *C23C 16/24* (2013.01); *C23C 16/42* (2013.01); *H01L 21/0245* (2013.01); *H01L 21/0262* (2013.01); *H01L 21/02532* (2013.01); *H01L 21/02579* (2013.01); *H01L 21/02592* (2013.01); *H01L 21/3205* (2013.01); *B82Y 40/00* (2013.01)

(58) Field of Classification Search
CPC .......... C23C 16/24; C23C 16/30; C23C 16/18
See application file for complete search history.

(56) References Cited

U.S. PATENT DOCUMENTS

| 5,854,095 | A | 12/1998 | Kang et al. | |
|---|---|---|---|---|
| 6,410,090 | B1* | 6/2002 | Wang | ................. C23C 16/24 257/E21.101 |
| 2004/0084678 | A1* | 5/2004 | Peng | ................ G02F 1/136213 257/72 |
| 2005/0101160 | A1* | 5/2005 | Garg | ................. H01L 21/2026 438/795 |
| 2006/0128139 | A1 | 6/2006 | Paranjpe et al. | |
| 2011/0269315 | A1 | 11/2011 | Hasebe et al. | |
| 2012/0142172 | A1* | 6/2012 | Fox | ................. C23C 16/24 438/488 |
| 2013/0244399 | A1* | 9/2013 | Okada | ............... H01L 21/76251 438/455 |
| 2013/0252384 | A1 | 9/2013 | Ryu et al. | |
| 2013/0267081 | A1* | 10/2013 | Fox | ................. H01L 21/324 438/486 |
| 2014/0061867 | A1* | 3/2014 | Airaksinen | ............ C23C 16/045 257/621 |
| 2014/0349468 | A1 | 11/2014 | Suzuki et al. | |
| 2016/0111537 | A1* | 4/2016 | Tsai | .................. H01L 29/7848 257/192 |
| 2017/0018477 | A1* | 1/2017 | Kato | ................. H01L 23/3192 |
| 2017/0287778 | A1* | 10/2017 | Okada | ............... H01L 21/76882 |

FOREIGN PATENT DOCUMENTS

| KR | 10-0224707 B1 | 10/1999 | | |
|---|---|---|---|---|
| KR | 10-0930140 B1 | 12/2009 | | |
| KR | 10-2011-0122059 A | 11/2011 | | |
| KR | 10-2014-0139413 A | 12/2014 | | |
| WO | WO 02/079211 | * | 10/2002 | ............... C07F 7/00 |

OTHER PUBLICATIONS

Quesada-Gonzalez, Miguel, et al., "Interstitial Boron-Doped TiO2 Thin Films: The Significant Effect of Boron on TiO2 Coatings Grown by Atmospheric Pressure Chemical Vapor Deposition". Applied Materials & Interfaces 2016, 8, 25024-25029.*
Deneuville, A., et al., "Highly and heavily boron doped diamond films". Diamond and Related Materials 16 (2007) 915-920.*
Si, Shangzhuo, et al., "Study of Boron-doped silicon carbide thin films". 2010 Symposium on Photonics and Optoelectronics, Chengdu, 2010, pp. 1-4. doi: 10.1109/SOPO.2010.5504009.*

* cited by examiner

*Primary Examiner* — Bret P Chen
(74) *Attorney, Agent, or Firm* — Rabin & Berdo, P.C.

(57) ABSTRACT

A method for forming an amorphous thin film comprises: forming a seed layer on a surface of a base by supplying aminosilane-based gas on the base; forming the first boron-doped amorphous thin film by supplying the first source gas including boron-based gas on the seed layer; and forming the second boron-doped amorphous thin film by supplying the second source gas including boron-based gas on the first amorphous thin film.

16 Claims, 3 Drawing Sheets

METHOD FOR FORMING AMORPHOUS THIN FILM

TECHNICAL FIELD

The present invention disclosed herein relates to a method for forming an amorphous thin film, and more particularly, to a method for depositing a film, which is capable of minimizing a surface roughness of the second amorphous thin film by forming the second boron-doped amorphous thin film after forming the first boron-doped amorphous thin film.

BACKGROUND ART

When depositing an amorphous thin film at low temperature (lower than 300 degrees C.), the surface roughness deteriorates rapidly if doping boron. Particularly, if the target thickness of the amorphous thin film is 200 Å, it may be difficult to forming the amorphous thin film having a surface roughness (RMS) equal to or less than 0.3 nm. Therefore, the technology for improving the surface roughness is needed.

DISCLOSURE

Technical Problem

The object of the present invention is to provide a method for depositing a film, which is capable of minimizing the surface roughness of an amorphous thin film.

Further another object of the present invention will become evident with reference to following detailed descriptions and accompanying drawings.

Technical Solution

Embodiments of the present invention provide a method for forming an amorphous thin film, the method comprising: forming a seed layer on a surface of a base by supplying aminosilane-based gas on the base; and forming the amorphous thin film having a predetermined thickness on the seed layer, wherein forming the amorphous thin film comprising: forming a first boron-doped amorphous thin film having a first thickness on the seed layer; and forming a second boron-doped amorphous thin film having a second thickness on the first boron-doped amorphous thin film, wherein a first gas used in the process forming the first boron-doped amorphous thin film includes boron-based gas and silane-based gas and be supplied to the seed layer, a second gas used in the process forming the second boron-doped amorphous thin film includes boron-based gas, being different from the first gas and being supplied to the first boron-doped amorphous thin film.

The boron-based gas may be $B_2H_6$.

Silane-based gas included in the first source gas may be $SiH_4$.

Silane-based gas included in the second source gas may be $Si_2H_6$ and the second amorphous thin film may be a silicon thin film, the forming the first amorphous thin film may be performed at 300 degrees C., and the forming the second amorphous thin film may be performed at 400 degrees C.

Silane-based gas included in the second source gas may be a mixed gas of $SiH_4$ and $Si_2H_6$ at a ratio of 4:1, and the second amorphous thin film may be a silicon thin film.

The second source gas may further include silane-based gas and germanium-based gas, and the silane-based gas and germanium-based gas included in the second source gas may be mixed at a ratio of 1:2.

Silane-based gas included in the second source gas may be $SiH_4$ and the second amorphous thin film is a silicon thin film, the first source gas may include $N_2$ 15000 sccm, and the second source gas may include $N_2$ 5000 sccm and $H_2$ 3000 sccm.

The second source gas may include germanium-based gas, and the second amorphous thin film is a germanium thin film.

The first thickness is 20 to 50 Å, the second thickness is 100 Å or more.

The method of claim 1, wherein the predetermined thickness is 200 Å or more.

Advantageous Effects

According to one embodiment of the present invention, it is possible to minimize the surface roughness of the second thin film by forming the second thin film after forming the first thin film.

BEST MODE

Hereinafter, exemplary embodiments of the present invention will be described in more detail with reference to FIGS. 1 to 3. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration.

Figure 1:
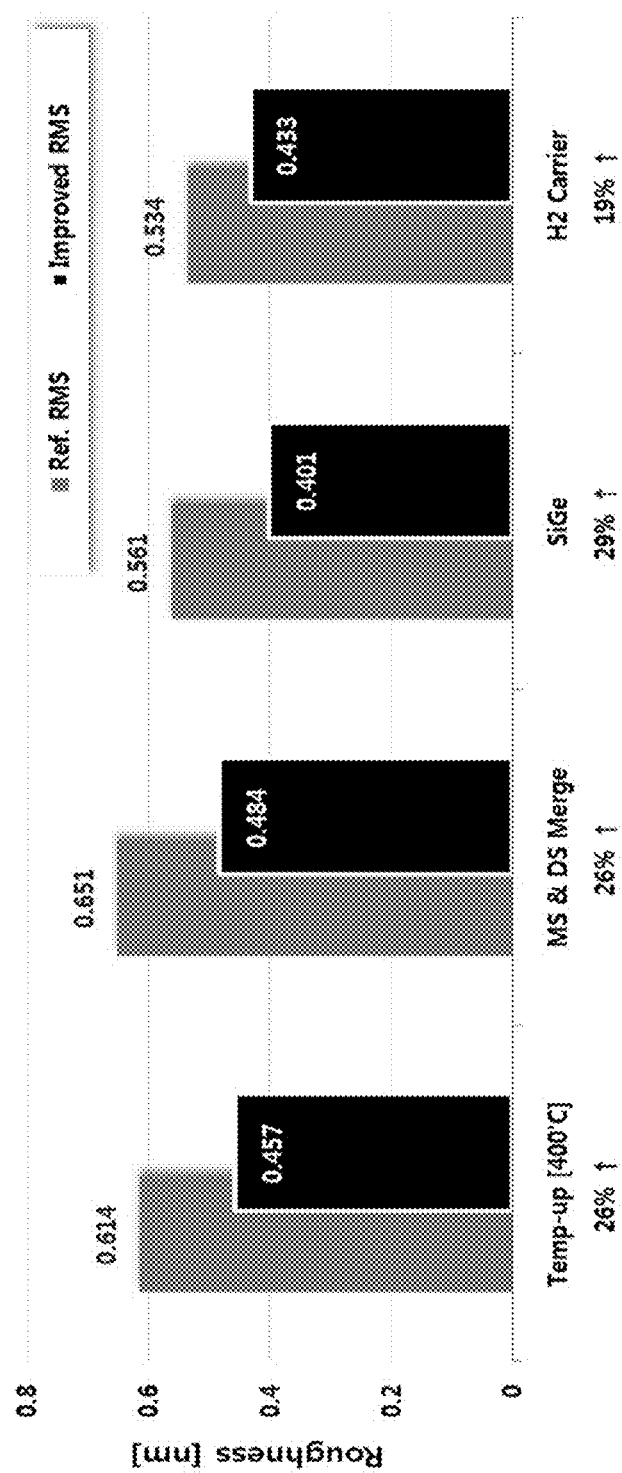
FIG. 1 is a graph illustrating a surface roughness of an amorphous thin film improved according to changes of process condition.

FIG. 1 is a graph illustrating a surface roughness of an amorphous thin film improved according to changes of process condition. First, a base is formed on a silicon substrate and the base may be a silicon oxide film or a silicon nitride film. A seed layer is formed on the base by supplying aminosilane-based gas (for example, DIPAS) onto a surface of the substrate and then an amorphous thin film is formed on the seed layer.

The amorphous thin film illustrated in FIG. 1 is formed under the process condition as the below Table 1 and, after the seed layer is formed by supplying the aminosilane-based gas for 30 seconds, the amorphous thin film is formed 200 Å. For reference, D/R means a deposition ratio.

Meanwhile, diborane ($B_2H_6$) is an example of boron-based gas and it may be substituted by another boron-based gas, unlike the below process condition.

TABLE 1

| Item | Temp [° C.] | SiH4 [SCCM] | Si2H6 [SCCM] | GeH4 [SCCM] | B2H6 [SCCM] | TN2 [SCCM] | H2 [SCCM] | D/R [A/sec] | B Conc. [at/cm3] | RMS [nm] |
|---|---|---|---|---|---|---|---|---|---|---|
| 300° C. Ref | 300 | 150 | — | — | 50 | 15000 | — | 1.1 | 4.8E21 | 0.53~0.65 |
| Temp-up | 400 | | | | | | — | 3.9 | 4.3E21 | 0.457 |
| MS& DS Merge | 300 | 40 | 10 | — | 1000 | 20000 | — | 3.15 | 5.4E21 | 0.484 |
| SiGe | | 50 | — | 100 | 150 | 5000 | — | 2.2 | 5.6E21 | 0.401 |
| H2 Carrier | | 150 | — | | 50 | 5000 | 3000 | 0.7 | 6.95E21 | 0.433 |
| GeB | | — | — | 500 | 100 | 5000 | 3000 | — | — | — |

As illustrated in FIG. 1, it can be understood that the surface roughness is improved as the process condition is changed from the reference process (300° C. Ref). Considering FIG. 1, the improved effect is as below.

The first is that the process temperature of the process condition of the amorphous thin film increases from 300 degrees C. to 400 degrees C., and in this case, the surface roughness is improved from 0.614 to 0.457.

The second is that the silane-based gas is changed from monosilane (SiH4) to a mixed gas of monosilane (SiH4) and disilane (Si2H6), and the monosilane and the disilane is mixed at a ratio of 4:1. In this case, the surface roughness is improved from 0.651 to 0.484.

The third is supplying GeH4, and in this case, the surface roughness is improved from 0.561 to 0.401.

The fourth is supplying hydrogen gas, and in this case, the surface roughness is improved from 0.534 to 0.433.

However, the surface roughness of the amorphous thin film varies as the thickness thereof increases as below. If it shows the Table 2 in a graph, it is as FIG. 2.

TABLE 2

| THK (Å) | 300° C. Ref | H2 Carrier | SiGe | MS&DS Merge |
|---|---|---|---|---|
| 50 | 0.238 | 0.492 | 0.463 | 0.363 |
| 100 | 0.355 | 0.514 | 0.424 | 0.370 |
| 200 | 0.551 | 0.500 | 0.436 | 0.409 |

Figure 2:
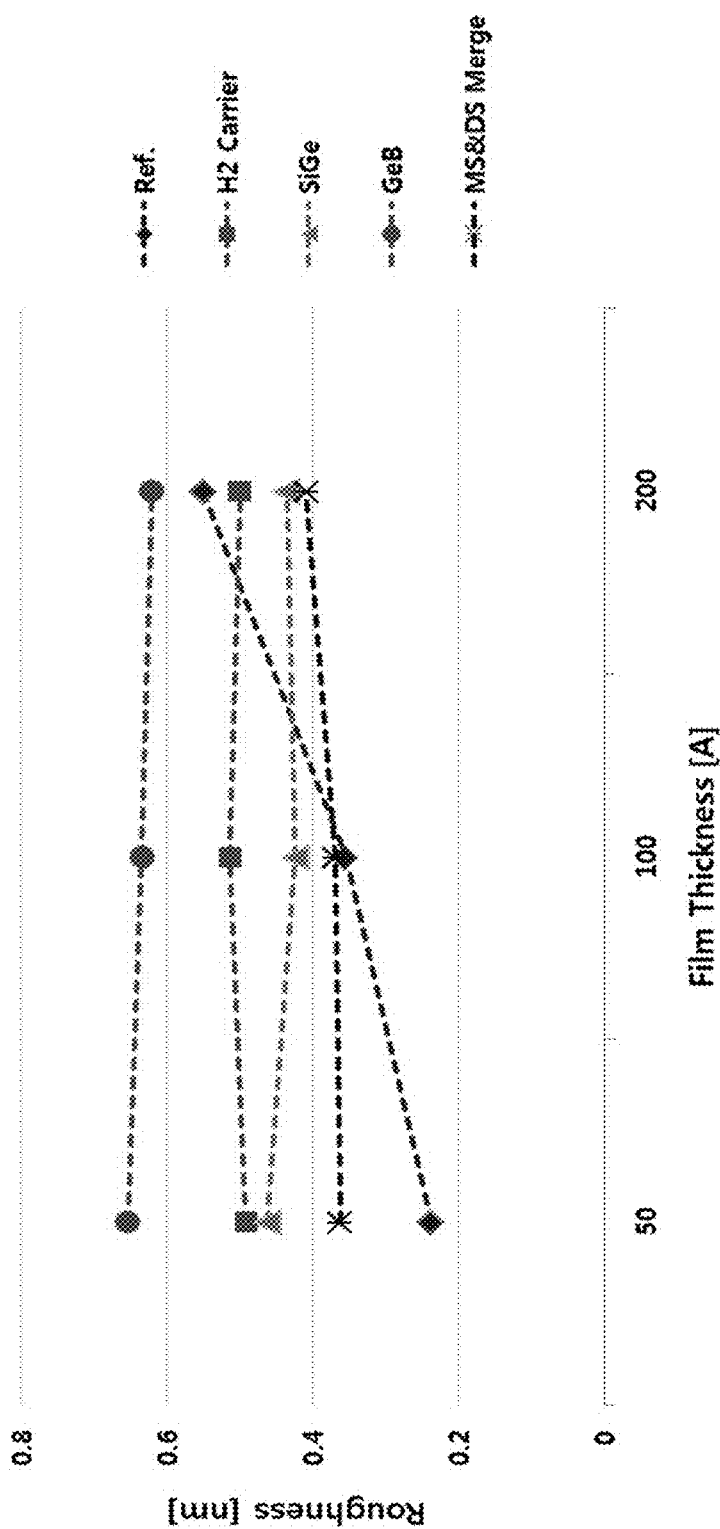
FIG. 2 is a graph illustrating a surface roughness of an amorphous thin film according to thickness increase.

That is, as Table 2 and FIG. 2, the surface roughness of the amorphous thin film is the most superior in the reference process compared with the remaining processes but, in the case of the reference process, the surface roughness increases rapidly as the thickness of the amorphous thin film increases. While, in the case of the remaining processes, the change of the surface roughness according to the thickness of the amorphous thin film is insignificant.

Figure 3:
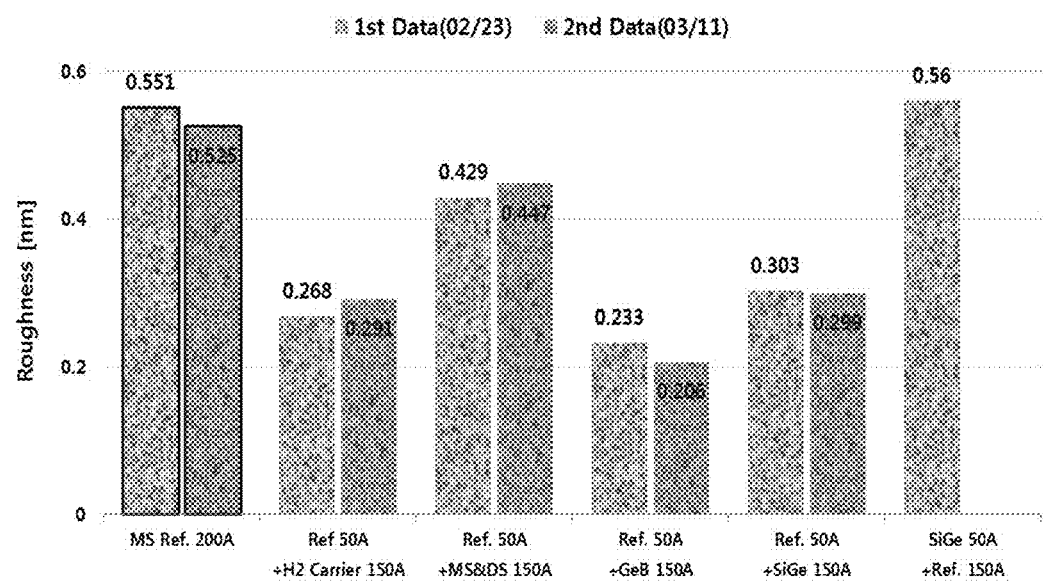
FIG. 3 is a graph illustrating a surface roughness of an amorphous thin film improved according to the first to fourth embodiments of the present invention.

With this point in view, by forming the second amorphous thin film through the respective process condition after forming the first amorphous thin film using the reference process, it can improve the surface roughness of the second amorphous thin film significantly, as illustrated in FIG. 3.

On the other hand, as listed in the fifth line of Table 1, the silane-based gas (monosilane or disilane) of the reference process can be substituted by germanium-based gas, and in this case, the amorphous thin film is not a silicon thin film but a germanium thin film. When the second amorphous thin film being the germanium thin film is formed on the above-described first amorphous thin film, it can be confirmed that the surface roughness of the second amorphous thin film is improved similarly.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The present invention may be applicable to a various apparatus for manufacturing semiconductor or a various method for manufacturing semiconductor.

What is claimed is:

1. A method for forming an amorphous thin film, the method comprising:
   forming a seed layer on a surface of a base by supplying aminosilane-based gas on the base; and
   forming the amorphous thin film having a predetermined thickness on the seed layer,
   wherein said forming the amorphous thin film comprises:
      forming a first boron-doped amorphous thin film having a first thickness on the seed layer; and
      forming a second boron-doped amorphous thin film having a second thickness on the first boron-doped amorphous thin film, and
   wherein a first source gas used in said forming the first boron-doped amorphous thin film includes boron-based gas and silane-based gas and be supplied to the seed layer, and a second source gas used in said forming the second boron-doped amorphous thin film includes the boron-based gas, the second source gas being different from the first source gas and being supplied to the first boron-doped amorphous thin film.

2. The method of claim 1, wherein the boron-based gas is B2H6.

3. The method of claim 2, wherein the silane-based gas included in the first source gas is SiH4.

4. The method of claim 3, wherein silane-based gas further included in the second source gas is Si2H6 and the second amorphous thin film is a silicon thin film,
   the forming the first amorphous thin film is performed at 300° C., and
   the forming the second amorphous thin film is performed at 400° C.

5. The method of claim 3, wherein silane-based gas further included in the second source gas is a mixed gas of SiH4 and Si2H6 at a ratio of 4:1, and
   the second amorphous thin film is a silicon thin film.

6. The method of claim 3, wherein the second source gas further includes silane-based gas and germanium-based gas, and
   the silane-based gas and germanium-based gas included in the second source gas are mixed at a ratio of 1:2.

7. The method of claim 3, wherein silane-based gas further included in the second source gas is SiH4 and the second amorphous thin film is a silicon thin film, the first source gas includes N2 15000 sccm, and the second source gas includes N2 5000 sccm and H2 3000 sccm.

8. The method of claim 3, wherein the second source gas further includes germanium-based gas, and the second amorphous thin film is a germanium thin film.

9. The method of claim 1, wherein the silane-based gas included in the first source gas is SiH4.

10. The method of claim 9, wherein silane-based gas further included in the second source gas is Si2H6 and the second amorphous thin film is a silicon thin film, the forming the first amorphous thin film is performed at 300° C., and the forming the second amorphous thin film is performed at 400° C.

11. The method of claim 9, wherein silane-based gas further included in the second source gas is a mixed gas of SiH4 and Si2H6 at a ratio of 4:1, and the second amorphous thin film is a silicon thin film.

12. The method of claim 9, wherein the second source gas further includes silane-based gas and germanium-based gas, and the silane-based gas and germanium-based gas included in the second source gas are mixed at a ratio of 1:2.

13. The method of claim 9, wherein silane-based gas further included in the second source gas is SiH4 and the second amorphous thin film is a silicon thin film, the first source gas includes N2 15000 sccm, and the second source gas includes N2 5000 sccm and H2 3000 sccm.

14. The method of claim 9, wherein the second source gas further includes germanium-based gas, and the second amorphous thin film is a germanium thin film.

15. The method of claim 1, wherein the first thickness is 20 to 50 Å, the second thickness is 100 Å or more.

16. The method of claim 1, wherein the predetermined thickness is 200 Å or more.

* * * * *